United States Patent
He et al.

(10) Patent No.: US 11,721,398 B2
(45) Date of Patent: *Aug. 8, 2023

(54) TECHNIQUES FOR DETERMINING MEMORY CELL READ OFFSETS

(71) Applicant: Micron Technology, Inc., Boise, ID (US)

(72) Inventors: Deping He, Boise, ID (US); Jingyuan Miao, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 17/502,497

(22) Filed: Oct. 15, 2021

(65) Prior Publication Data

US 2022/0108753 A1 Apr. 7, 2022

Related U.S. Application Data

(63) Continuation of application No. 16/941,894, filed on Jul. 29, 2020, now Pat. No. 11,158,387.

(51) Int. Cl.
*G11C 11/34* (2006.01)
*G11C 16/26* (2006.01)
*G11C 11/56* (2006.01)

(52) U.S. Cl.
CPC .......... *G11C 16/26* (2013.01); *G11C 11/5642* (2013.01); *G11C 11/5671* (2013.01)

(58) Field of Classification Search
CPC ......... G11C 16/10; G11C 16/30; G11C 16/12; G11C 16/0483; H01L 27/115
USPC ................... 365/185.18, 185.22, 185.24
See application file for complete search history.

(56) References Cited

U.S. PATENT DOCUMENTS

| | | | |
|---|---|---|---|
| 9,799,405 B1 * | 10/2017 | Micheloni | G11C 16/28 |
| 10,395,729 B2 | 8/2019 | Perner | |
| 10,699,791 B2 | 6/2020 | Pletka et al. | |
| 11,158,387 B1 * | 10/2021 | He | G11C 11/5671 |

* cited by examiner

*Primary Examiner* — Son T Dinh
(74) *Attorney, Agent, or Firm* — Holland & Hart LLP (57) ABSTRACT

Methods, systems, and devices for techniques for determining memory cell read offsets are described to support determining voltage offsets and corresponding read voltage levels for one or more memory cell levels using a relationship between read voltage levels and voltage offsets. A memory device may estimate first voltage offsets using a first procedure and may perform a read operation using the first voltage offsets. If a first voltage offset results in a read error for a corresponding memory cell level, the memory device may determine an updated voltage offset using the relationship. The relationship may predict a voltage offset for a given read voltage level, such that the memory device may use the relationship to predict an updated voltage offset for a memory cell level. The memory device may use the updated voltage offset(s) to perform a second read operation for the one or more memory cells.

20 Claims, 6 Drawing Sheets

TECHNIQUES FOR DETERMINING MEMORY CELL READ OFFSETS

CROSS REFERENCE

The present Application for Patent is a continuation of U.S. patent application Ser. No. 16/941,894 by He et al., entitled "TECHNIQUES FOR DETERMINING MEMORY CELL READ OFFSETS," filed Jul. 29, 2020, assigned to the assignee hereof, and is expressly incorporated by reference in its entirety herein.

BACKGROUND

The following relates generally to one or more systems for memory and more specifically to techniques for determining memory cell read offsets.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), 3-dimensional cross-point memory (3D cross point), not-or (NOR), and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

A memory cell may include one or more levels for storing various logic values, and a level of the memory cell may be read during a read operation using a respective read voltage level. A baseline read voltage level (e.g., a defined static voltage level) for each memory cell level may be used to access (e.g., read) a logic value stored by a respective level. In some cases, due to factors such as environmental conditions (e.g., temperature), a usage level, memory cell wear, threshold voltage shift, or any combination thereof (e.g., among other examples), a read voltage level of a memory cell may drift or change over time. As such, a baseline read voltage level may not function to access or read a logic value from a memory cell level that experiences this drift. As such, a memory device may be configured to perform a calibration procedure to determine an offset (e.g., an amount of drift or change) to the read voltage level for one or more levels of a memory cell.

A first portion of the calibration procedure may include taking sample voltage threshold measurements for a memory cell level and determining a read voltage level for the memory cell level based on a lowest threshold voltage value. The sample voltage threshold measurements may correspond to a measurement window and in some cases, the measurement window may not align with a lowest voltage threshold value for a memory cell level. Accordingly, some read voltage levels and corresponding voltage offsets for some memory cell levels may remain inaccurate after performing the first portion of the calibration procedure.

The present disclosure provides techniques for determining read voltage levels and corresponding voltage offsets for one or more memory cell levels in a calibration procedure using a relationship (e.g., a linear or a non-linear relationship or some combination of both) between read voltage levels and voltage offsets. The relationship may calculate or predict a voltage offset for a respective read voltage level (e.g., baseline read voltage level) such that the memory device may use the relationship to predict an updated voltage offset for a memory cell level. Determining the updated voltage offset may further support determination of a new or adjusted read voltage level for the memory cell level. For example, the memory device may perform a second portion of the calibration procedure (after a first portion of a calibration procedure) and may estimate new or updated voltage offsets and corresponding read voltage levels for the one or more memory cell levels using a relationship between the read voltage levels and the voltage offsets. Performing the second portion of the calibration procedure may return lower bit error rates for reading memory cells of the memory device and may support reading memory cell levels that may otherwise result in a read error.

Features of the disclosure are initially described in the context of systems as described with reference to FIG. 1. Features of the disclosure are described in the context a calibration scheme, an offset voltage relationship, and a flow diagram as described with reference to FIGS. 2-4. These and other features of the disclosure are further illustrated by and described with reference to an apparatus diagram and flowcharts that relate to techniques for determining memory cell read offsets as described with reference to FIGS. 5 and 6.

Figure 1:
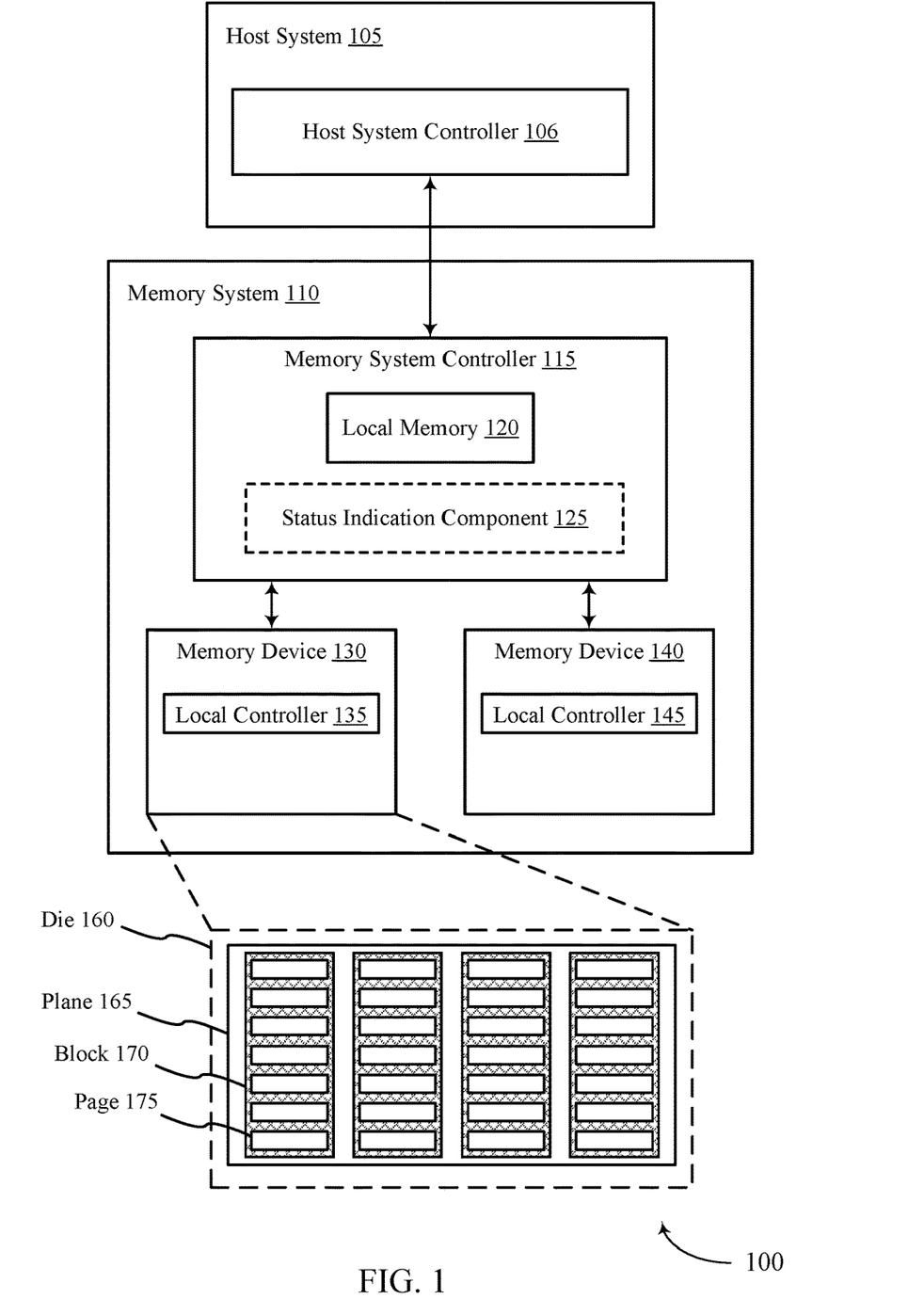
FIG. 1 illustrates an example of a system that supports techniques for determining memory cell read offsets in accordance with examples as disclosed herein.

FIG. 1 illustrates an example of a system 100 that supports techniques for data programming in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. The host system 105 may include one or more devices, and in some cases may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., PCIe controller, SATA controller). The host system 105 may use the memory system 110, for example, to write data to the memory system 110 and read data from the memory system 110. Although one memory system 110 is shown in FIG. 1, it is to be understood that the host system 105 may be coupled with any quantity of memory systems 110.

The host system 105 may be coupled with the memory system 110 via at least one physical host interface. The host system 105 and the memory system 110 may in some cases be configured to communicate via a physical host interface using an associated protocol (e.g., to exchange or otherwise communicate control, address, data, and other signals between the memory system 110 and the host system 105). Examples of a physical host interface may include, but are not limited to, a serial advanced technology attachment (SATA) interface, a UFS interface, an eMMC interface, a peripheral component interconnect express (PCIe) interface, USB interface, Fiber Channel, Small Computer System Interface (SCSI), Serial Attached SCSI (SAS), Double Data Rate (DDR), a dual in-line memory module (DIMM) interface (e.g., DIMM socket interface that supports DDR), Open NAND Flash Interface (ONFI), Low Power Double Data Rate (LPDDR). In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 or memory device 140 included in the memory system 110, or via a respective physical host interface for each type of memory device 130 or memory device 140 included in the memory system 110.

Memory system 110 may include a memory system controller 115, a memory device 130, and a memory device 140. A memory device 130 may include one or more memory arrays of a first type of memory cells (e.g., a type of non-volatile memory cells), and a memory device 140 may include one or more memory arrays of a second type of memory cells (e.g., a type of volatile memory cells). Although one memory device 130 and one memory device 140 are shown in the example of FIG. 1, it is to be understood that memory system 110 may include any quantity of memory devices 130 and memory devices 140, and that, in some cases, memory system 110 may lack either a memory device 130 or a memory device 140.

The memory system controller 115 may be coupled with and communicate with the host system 105 (e.g., via the physical host interface). The memory system controller 115 may also be coupled with and communicate with memory devices 130 or memory devices 140 to perform operations such as reading data, writing data, erasing data, or refreshing data at a memory device 130 or a memory device 140, and other such operations, which may generically be referred to as access operations. In some cases, the memory system controller 115 may receive commands from the host system 105 and communicate with one or more memory devices 130 or memory devices 140 to execute such commands (e.g., at memory arrays within the one or more memory devices 130 or memory devices 140). For example, the memory system controller 115 may receive commands or operations from the host system 105 and may convert the commands or operations into instructions or appropriate commands to achieve the desired access of the memory devices 130 or memory devices 140. And in some cases, the memory system controller 115 may exchange data with the host system 105 and with one or more memory devices 130 or memory devices 140 (e.g., in response to or otherwise in association with commands from the host system 105). For example, the memory system controller 115 may convert responses (e.g., data packets or other signals) associated with the memory devices 130 or memory devices 140 into corresponding signals for the host system 105.

The memory system controller 115 may be configured for other operations associated with the memory devices 130 or memory devices 140. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130 or memory devices 140.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions)

executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored to the local memory 120 when read from or written to a memory device 130 or memory device 140, and may be available within the local memory 120 for subsequent retrieval for or manipulation (e.g., updating) by the host system 105 (e.g., with reduced latency relative to a memory device 130 or memory device 140) in accordance with a cache policy.

Although the example of memory system 110 in FIG. 1 has been illustrated as including the memory system controller 115, in some cases, a memory system 110 may not include a memory system controller 115. For example, the memory system 110 may additionally or alternatively rely upon an external controller (e.g., implemented by the host system 105) or one or more local controllers 135 or local controllers 145, which may be internal to memory devices 130 or memory devices 140, respectively, to perform the functions ascribed herein to the memory system controller 115. In general, one or more functions ascribed herein to the memory system controller 115 may in some cases instead be performed by the host system 105, a local controller 135, or a local controller 145, or any combination thereof.

A memory device 140 may include one or more arrays of volatile memory cells. For example, a memory device 140 may include random access memory (RAM) memory cells, such as dynamic RAM (DRAM) memory cells and synchronous DRAM (SDRAM) memory cells. In some examples, a memory device 140 may support random access operations (e.g., by the host system 105) with reduced latency relative to a memory device 130, or may offer one or more other performance differences relative to a memory device 130.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric RAM (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), and electrically erasable programmable ROM (EEPROM).

In some examples, a memory device 130 or a memory device 140 may include (e.g., on a same die or within a same package) a local controller 135 or a local controller 145, respectively, which may execute operations on one or more memory cells of the memory device 130 or the memory device 140. A local controller 135 or a local controller 145 may operate in conjunction with a memory system controller 115 or may perform one or more functions ascribed herein to the memory system controller 115. In some cases, a memory device 130 or a memory device 140 that includes a local controller 135 or a local controller 145 may be referred to as a managed memory device and may include a memory array and related circuitry combined with a local (e.g., on-die or in-package) controller (e.g., local controller 135 or local controller 145). An example of a managed memory device is a managed NAND (MNAND) device.

In some cases, a memory device 130 may be or include a NAND device (e.g., NAND flash device). The memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, performing concurrent operations in different planes 165 may be subject to one or more restrictions, such as identical operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be rewritten with new data. Thus, for example, a used page 175 may in some cases not be updated until the entire block 170 that includes the page 175 has been erased.

The system 100 may include any quantity of non-transitory computer readable media that support techniques for determining memory cell read offsets. For example, the host system 105, the memory system controller 115, a memory device 130, or a memory device 140 may include or otherwise may access one or more non-transitory computer readable media storing instructions (e.g., firmware) for performing the functions ascribed herein to the host system 105, memory system controller 115, memory device 130, or memory device 140. For example, such instructions, when executed by the host system 105 (e.g., by the host system controller 106), by the memory system controller 115, by a memory device 130 (e.g., by a local controller 135), or by a memory device 140 (e.g., by a local controller 145), may cause the host system 105, memory system controller 115, memory device 130, or memory device 140 to perform associated functions as described herein.

A memory cell may include one or more levels, and a level of the memory cell may be read during a read operation using a respective read voltage level. In some cases, due to factors such as environmental conditions (e.g., temperature), a usage level, memory cell wear, threshold voltage shift, or any combination thereof (e.g., among other examples), a read voltage level of a memory cell may drift or change over time. As such, a baseline read voltage level may not function to access or read a logic value from a memory cell level that experiences this drift. As such, a system 100 may perform a calibration procedure to determine an offset (e.g., an amount of drift or change) to the read voltage level for one or more levels of a memory cell. A first portion of the calibration procedure may include taking sample voltage threshold measurements for a memory cell level and determining a read voltage level for the memory cell level based on a lowest threshold voltage value. In some cases, read voltage levels and corresponding voltage offsets for some memory cell levels may remain inaccurate after performing the first portion of the calibration procedure.

The present disclosure provides techniques for determining read voltage levels and corresponding voltage offsets for one or more memory cell levels in a second portion of a calibration procedure using a relationship (e.g., a linear, a non-linear relationship, some combination of a linear relationship and a non-linear relationship) between read voltage levels and voltage offsets. The relationship may calculate or predict a voltage offset for a given read voltage level (e.g., baseline read voltage level). The second portion of the calibration procedure and may include estimating new or updated voltage offsets and corresponding read voltage levels for the one or more memory cell levels using a relationship between the read voltage levels and the voltage offsets. Performing the second portion of the calibration procedure may return lower bit error rates for reading memory cells of the memory device and may support reading memory cell levels that may otherwise result in a read error.

Figure 2:
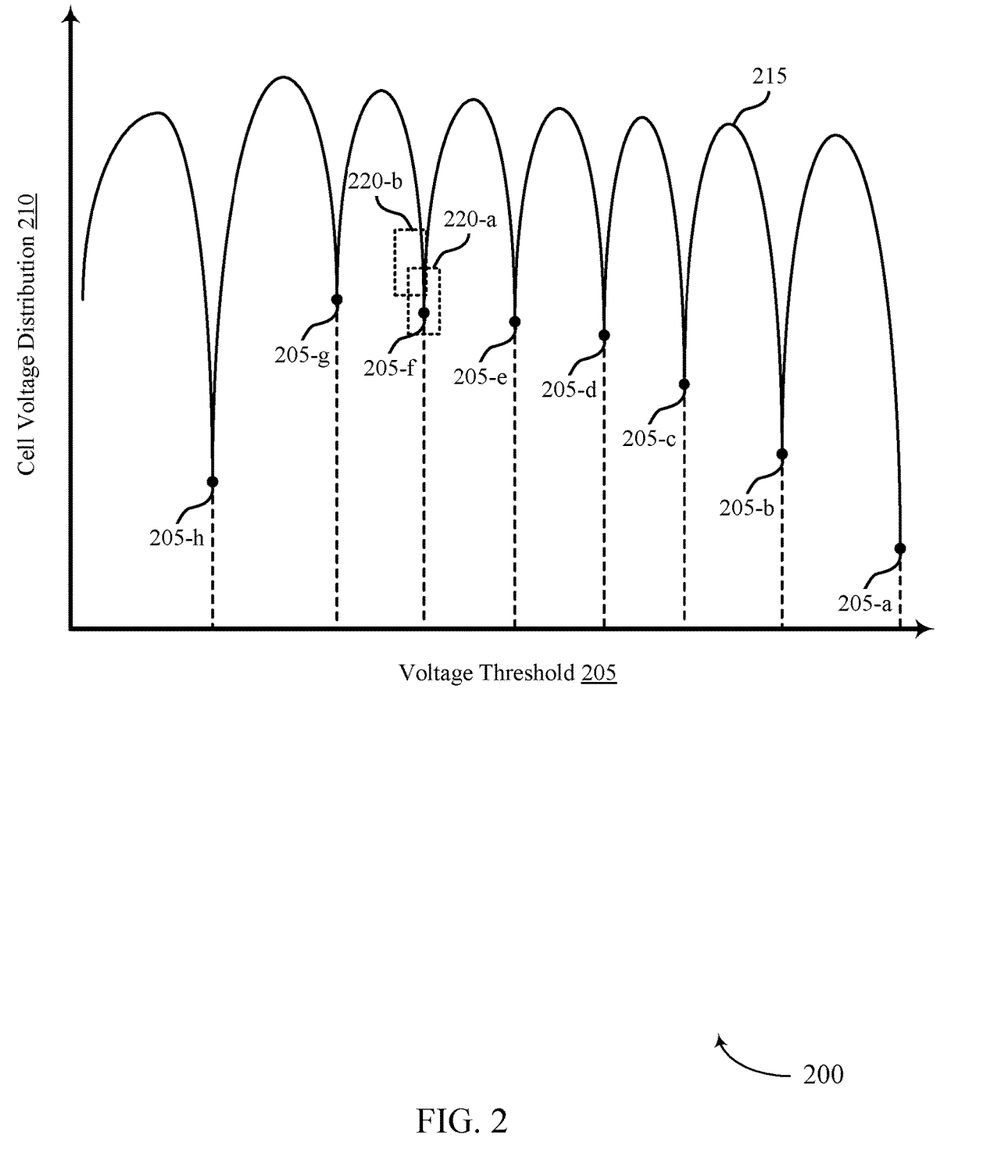
FIG. 2 illustrates an example of a calibration scheme that supports techniques for determining memory cell read offsets in accordance with examples as disclosed herein.

FIG. 2 illustrates an example of a calibration scheme 200 that supports techniques for determining memory cell read offsets in accordance with examples as disclosed herein. Some aspects of calibration scheme 200 may be implemented by a system 100 (e.g., a memory device) as described with reference to FIG. 1, such as by a memory device 130 or 140 or by a memory system controller 115. For example, calibration scheme 200 may be used to determine respective offsets to one or more read voltage levels of a memory cell, such as a multi-level cell (MLC) or multi-level memory cell. An MLC may include a distribution of different logic values that may be stored at respective levels of the memory cell, for example, as a voltage threshold of the respective memory cell level.

The memory cell may include one or more levels, and each level of the memory cell may be read (e.g., during a read operation) using a respective read voltage level, which may be related to a voltage threshold 205 of the memory cell level. For example, a first level of the memory cell may be associated with a lower read voltage level (e.g., and related voltage threshold 205-a) than a second level of the memory cell, and the second level may be associated with a lower read voltage level (and related voltage threshold 205-b) than a third level of the memory cell (e.g., associated with a read voltage level and voltage threshold 205-c), and so on. Voltage thresholds 205 may be associated with a cell voltage distribution 210, and may represent a minimum voltage that may be applied to the respective memory cell level (e.g., the voltage threshold 205 may be met or exceeded) in order to read or write a logic value associated with the respective memory cell level.

As described herein, each level of the memory cell may be associated with a respective read voltage level. A baseline read voltage level (e.g., a predefined static voltage) for each memory cell level may be used to access or read a logic value stored by a respective level. In some cases, due to factors such as environmental conditions (e.g., temperature), a usage level, memory cell wear, threshold voltage shift, or any combination thereof (e.g., among other examples), a read voltage level of a memory cell may drift or change over time. As such, a baseline read voltage level may not function to access or read a logic value from a memory cell level that experiences this drift.

For example, a read voltage level (e.g., related to voltage threshold 205-a) of a memory cell level may drift or change over time to a higher read voltage level (e.g., may be offset over time). As such, if the original baseline read voltage level is applied to read a logic value from the memory cell level, the read voltage level may be insufficient because it is lower than the new, higher read voltage level (e.g., and higher related voltage threshold 205). As such, a memory device may perform a calibration procedure, such as calibration scheme 200, to determine an offset (e.g., an amount of drift or change) to the read voltage level for one or more levels of a memory cell.

A first portion of the calibration procedure may be referred to as auto-recovery calibration (ARC), in which the memory device may identify one or more portions of a distribution 215 of read voltage levels and corresponding voltage thresholds 205 for the one or more levels of the memory cell. The memory device may use the one or more portions of the distribution 215 to determine a current read voltage level for the one or more memory cell levels and an associated offset from the baseline read voltage level. The memory device may take sample voltage threshold measurements for the one or more memory cell levels (e.g., five voltage threshold measurements for each memory cell level). For example, for each memory cell level, the memory device may take sample voltage threshold measurements within a window 220 and may determine that the associated read voltage level for the memory cell level corresponds to a voltage threshold 205 associated with a lowest cell voltage distribution 210 value.

The memory device may determine portions of the distribution 215 of read voltage levels and corresponding voltage thresholds 205, for example, by taking a number of samples within one window 220 for each memory cell level and refraining from taking samples outside of a respective window 220 (e.g., the memory device may not create a full distribution 215). For example, the memory device may take samples within a window 220-a in order to determine a read voltage level (e.g., related to voltage threshold 205-f) for a corresponding memory cell level. The memory device may limit sampling to respective windows 220, for example, to reduce an amount of time spent performing the calibration procedure and thereby reduce latency in device performance and data access.

In some cases, a window 220 may not align with a lowest cell voltage distribution 210 value for a memory cell level, for example, due to a larger drift in a read voltage level. Accordingly, using the lowest cell voltage distribution 210 value within the window 220 may not give an accurate estimation of the corresponding read voltage level and associated voltage threshold 205. For example, window 220-*b* may be used to take samples and estimate a read voltage level (e.g., related to voltage threshold 205-*f*), and a lowest cell voltage distribution 210 value from window 220-*b* may not correspond to a lowest cell voltage distribution 210 value for the read voltage level (e.g., which may instead be found within window 220-*a*). Thus, some read voltage levels and corresponding voltage offsets for some memory cell levels may remain inaccurate after performing the first portion (e.g., ARC) of the calibration procedure, which may result in reading inaccurate logic values from the memory cells (e.g., may return an error, such as an uncorrectable error correction code (UECC)).

The present disclosure provides techniques for determining read voltage levels and corresponding voltage offsets for one or more memory cell levels that remain inaccurate after performing a first portion of the calibration procedure, for example, techniques that can be performed in a second portion of the calibration procedure.

The memory device may, for example, estimate an updated voltage offset for each of the one or more memory cell levels using a relationship between read voltage levels and voltage offsets. For example, a physical relationship (e.g., a statistical or empirical relationship, or predicted by physics) may exist between read voltage levels and voltage offsets. The relationship may predict a voltage offset for a given read voltage level (e.g., baseline read voltage level), such that the memory device may access the relationship in order to predict an updated voltage offset for a memory cell level. Determining the updated voltage offset may further support determination of a new or adjusted read voltage level for the memory cell level.

The relationship may be, at least in part, a linear association between read voltage levels and voltage offsets, which may be stored at or determined by the memory device. For example, the memory device may store or have access to a slope of a line representing a linear relationship between the read voltage levels and the voltage offsets, which may support determination of a voltage offset for a corresponding read voltage level (e.g., baseline read voltage level). In some cases, at least some portions of the relationship may be non-linear in character, such as for higher or lower read voltage levels or some subset of the read voltage levels. The relationship between the read voltage levels and the voltage offsets is further described herein with reference to FIG. 3.

As described herein, a memory device may perform a read procedure using baseline read voltages for corresponding memory cell levels. If one or more levels return an error or are unable to be read using the baseline read voltage levels (e.g., based on a read voltage level drift), the memory device may perform the first portion (e.g., ARC) of the calibration procedure and may estimate new read voltage levels and corresponding voltage offsets for the one or more memory cell levels based on samples of voltage thresholds 205 and cell voltage distributions 210 within corresponding windows of read voltage levels. The memory device may perform a second read procedure using the new read voltage levels.

If one or more memory cell levels return an error or are unable to be read using the new read voltage levels, the memory device may perform the second portion of the calibration procedure and may estimate second new read voltage levels and corresponding voltage offsets for the one or more memory cell levels using a relationship between the read voltage levels and the voltage offsets. Performing the second portion of the calibration procedure may return lower bit error rates for reading memory cells of the memory device and may support reading memory cells, or levels thereof, that may otherwise return an error (e.g., may change a UECC result to a correctable error correction code (CECC) result).

Figure 3:
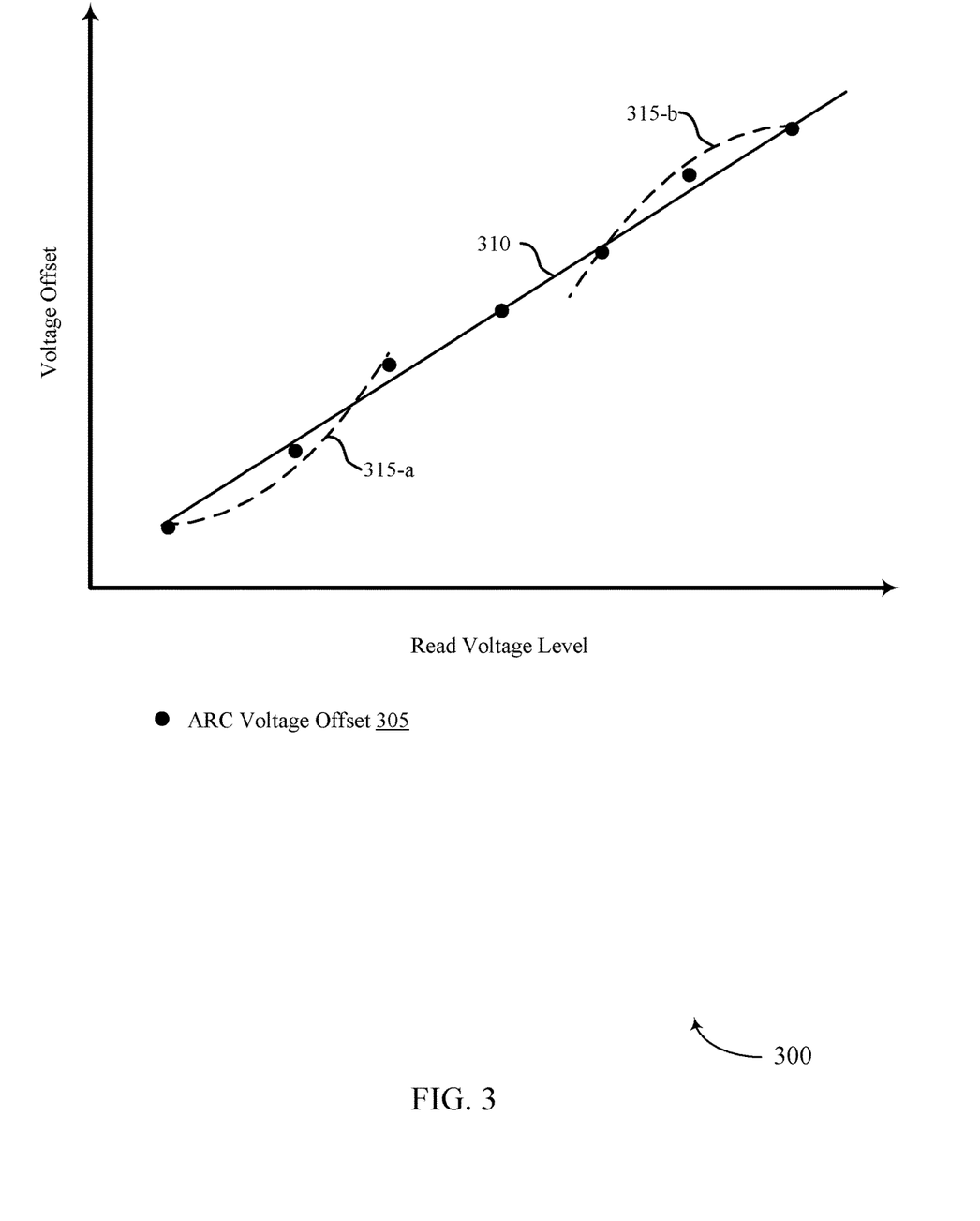
FIG. 3 illustrates an example of an offset voltage relationship that supports techniques for determining memory cell read offsets in accordance with examples as disclosed herein.

FIG. 3 illustrates an example of a relationship 300 that supports techniques for determining memory cell read offsets in accordance with examples as disclosed herein. Some aspects of relationship 300 may be implemented by a system 100 (e.g., a memory device) as described with reference to FIG. 1, such as by a memory device 130 or 140 or by a memory system controller 115. As described with reference to FIG. 2, relationship 300 may be used to determine one or more updated voltage offsets for corresponding voltage read levels of a memory cell, such as an MLC. For example, relationship 300 may include or demonstrate a correlation, association, or other relationship between read voltage levels and voltage offsets.

A memory device may use relationship 300 to determine one or more updated voltage offsets, for example, after performing a first portion of a calibration procedure (e.g., as described with reference to FIG. 2). The first portion of the calibration procedure may represent an ARC process and may include determining or estimating one or more ARC voltage offsets 305 using a process similar to that described with reference to FIG. 2. Relationship 300 may be determined or configured using the one or more ARC voltage offsets 305, for example, by performing a linear fit 310, a non-linear fit 315, or any combination thereof, on the one or more ARC voltage offsets 305 with respect to corresponding read voltage levels. In such cases, a linear fit 310 and/or a non-linear fit 315 may be determined based on a correlation (e.g., regression), among other examples.

In some other cases, a linear fit 310 and/or a non-linear fit 315 may be determined based on one or more physical attributes of associated memory cells or levels thereof. For example, relationship 300 may be determined based on scientific or physical principles, or based on testing of one or more memory cells or levels thereof. The testing may represent a form of a stress test (e.g., performed at a calibration stage), which may be used to categorize a trend of how voltage offset shifts or changes under some conditions. A physical representation (e.g., a fit, such as a linear fit 310 or non-linear fit 315) of the trend of voltage offset shifting may be used to determine relationship 300. For example, coefficients (e.g., slopes and/or intercepts) of a linear fit 310 or a non-linear fit 315 may be stored at the memory device and may be accessed by the memory device to determine relationship 300. In some cases, the memory device may access different coefficients (e.g., for different fits or relationships) based on one or more factors, such as device usage, device temperature, or previous read voltage levels, among other examples.

In some examples, relationship 300 may represent a linear association or a linear fit 310, which may represent a linear relationship between voltage offsets and respective read voltage levels. In some examples, relationship 300 may represent a non-linear association or non-linear fit 315 between the voltage offsets and respective read voltage levels. In some examples, relationship 300 may represent a combination of portions of one or more linear fits 310 and non-linear fits 315. For example, a lower end of relationship 300 may be represented by a non-linear fit 315-a and the rest of relationship 300 may be represented by the linear fit 310, or an upper end of relationship 300 may be represented by a non-linear fit 315-b and the rest of relationship 300 may be represented by the linear fit 310. In some cases, portions of the lower end and upper end of relationship 300 may be represented by non-linear fits 315-a and 315-b, respectively, while the rest of relationship 300 may be represented by the linear fit 310. For example, the lower end and upper end of relationship 300 may experience more error than other portions of relationship 300 when represented by a linear fit 310, and may therefore instead be represented by one or more non-linear fits 315.

In some cases, relationship 300 may apply to some memory cells and not to other memory cells. For example, memory cells may be grouped into sets of memory cells, with each set of memory cells associated with a respective relationship 300. A set of memory cells may be represented by a page, or by a multiple of a page (e.g., based on a page size as a base unit). In some cases, a relationship 300 determined for one set of memory cells (e.g., one page of memory cells) may be used to generate or determine an offset for another set of memory cells (e.g., another set of memory cells). For example, relationship 300 may be based on the ARC voltage offsets 305 from a first page of memory cells, and one or more values (e.g., three values) from the ARC voltage offsets 305 may be used to determine a relationship for a second page of memory cells (e.g., without performing ARC for the second page), which may minimize reads or re-reads for the second page of memory cells.

In some cases, relationship 300 may be preconfigured and stored at the memory device, and in some cases, relationship 300 may be determined by the memory device (e.g., by a controller or other component of the memory device). The memory device may use relationship 300, or a similar relationship, to predict a voltage offset for reading a logic value from one or more memory cell levels if a first portion (e.g., ARC) of a calibration process for the one or more memory cell levels fails or returns an error (e.g., an UECC or read fail). For example, the memory device may use relationship 300, or a similar relationship, to perform another read operation on the one or more memory cell levels. Using relationship 300 for a read operation may result in a successful read of the one or more memory cell levels, which may decrease a bit error rate of the one or more memory cell levels (e.g., and may change a UECC result to a CECC result).

Figure 4:
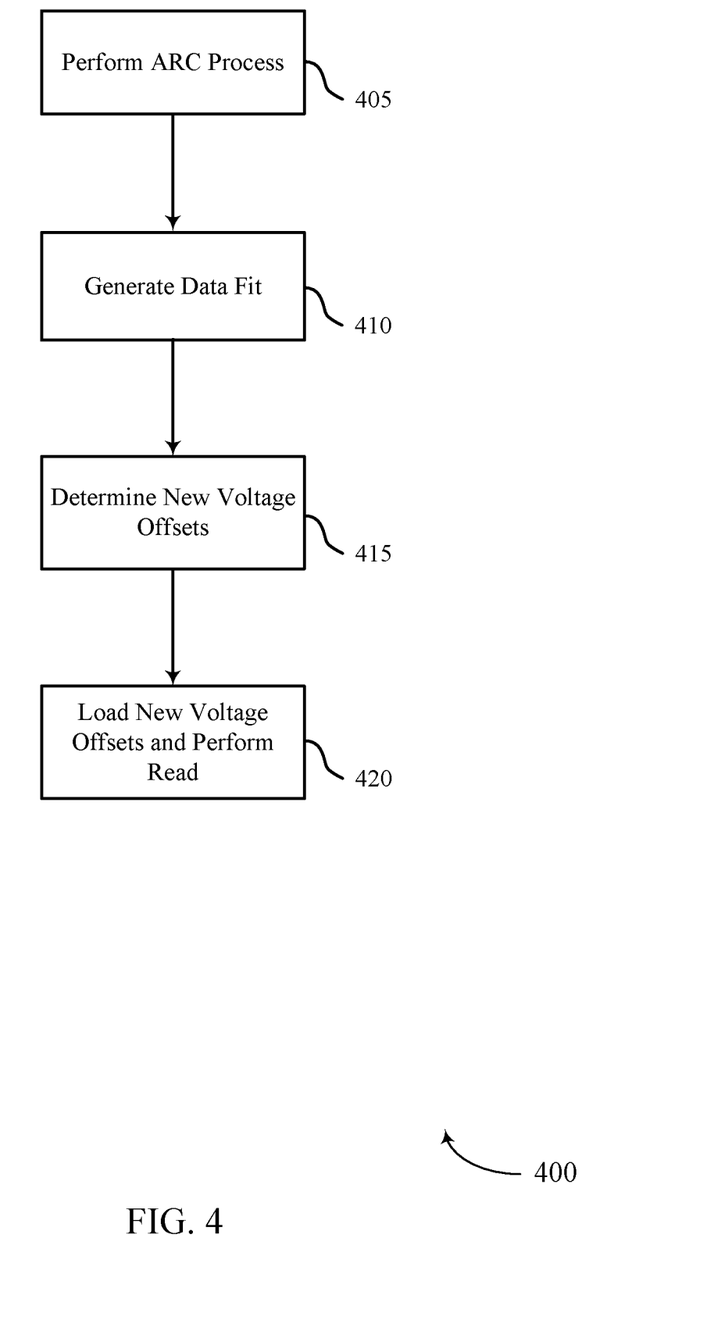
FIG. 4 illustrates an example of a flow diagram that supports techniques for determining memory cell read offsets in accordance with examples as disclosed herein.

FIG. 4 illustrates an example of a flow diagram 400 that supports techniques for determining memory cell read offsets in accordance with examples as disclosed herein. Some aspects of flow diagram 400 may be implemented by a system 100 (e.g., a memory device) as described with reference to FIG. 1, such as by a memory device 130 or 140 or by a memory system controller 115. As described with reference to FIGS. 2 and 3, a memory device may implement aspects of flow diagram 400 to update or refine one or more offset voltages for reading one or more memory cell levels.

For example, after performing a first portion (e.g., ARC process) of a calibration procedure (e.g., as described with reference to FIG. 2), the memory device may attempt a read operation based on the first portion of the calibration procedure and may determine that one or more memory cell levels fail the read operation (e.g., return a UECC). The memory device may determine or identify a relationship between a voltage offset for the one or more memory cell levels and a read voltage for the one or more memory cell levels and may use the relationship to determine an updated voltage offset for the one or more memory cell levels. The memory device may update a read voltage level for each of the one or more memory cell levels from a static read voltage level to an updated read voltage level based on the updated voltage offset(s) and may perform a read operation based on the updated read voltage level(s) and/or updated voltage offset(s).

For example, at 405, the memory device may perform an ARC process as a first portion of a calibration procedure (e.g., after attempting a first read operation). As described with reference to FIG. 2, the ARC process may include sampling voltage threshold values at different read voltage levels to determine a read voltage level and/or voltage offset for memory cell levels that may have failed the first read operation. In some cases, part of the ARC process may include performing a second read operation on memory cell levels that may have failed the first read operation, for example, using the read voltage levels and/or voltage offsets determined by the ARC process.

Using the read voltage offsets may include updating respective read voltage levels from a static read voltage level (e.g., a default or predefined read voltage level) to a new read voltage level by an amount of the respective voltage offset. The memory device may use the new read voltage levels to attempt to read the memory cell levels that may have failed the first read operation. In some cases, one or more memory cell levels may also fail the second read operation (e.g., may return a UECC).

At 410, the memory device may generate a data fit (e.g., a relationship) for use in a second portion of the calibration procedure, for example, as described with reference to FIG. 3. In some cases, the memory device may collect each of the voltage offsets determined by the ARC process (e.g., and used during the second read operation) and may generate the data fit (e.g., a linear fit, a non-linear fit, or any combination thereof) for the voltage offsets with respect to corresponding read voltage levels (e.g., based on a correlation, a regression, or another determined relationship). In some cases, the memory device may access stored information (e.g., preconfigured information) to determine the data fit. For example, the memory device may access one or more stored coefficients or slopes to generate the data fit.

At 415, the memory device may determine, using the generated data fit, new or updated voltage offsets for the one or more memory cell levels that may have failed the second read operation. The memory device may identify the one or more memory cell levels and may determine respective voltage offsets for the one or more memory cell levels using the data fit or relationship generated at 410. For example, the memory device may identify one or more memory cell levels and corresponding read voltage levels that may have failed the second read operation, and may identify voltage offset values that correspond to the one or more read voltage levels using the data fit or relationship.

At 420, the memory device may load the new voltage offsets and may perform a third read operation using the new voltage offsets. The memory device may determine a new read voltage level for each of the one or more memory cell levels that may have failed the second read operation based on a corresponding static (e.g., default) read voltage level and new voltage offset. For example, the memory device may determine the new read voltage level by combining the static read voltage level and the corresponding new voltage offset. The memory device may perform the third read operation on the one or more memory cell levels that may have failed the second read operation, for example, using the one or more new read voltage levels. The third read operation may result in a successful read of the one or more memory cell levels, which may decrease a bit error rate of the one or more memory cell levels (e.g., and may change a UECC result to a CECC result), for example, based on the new voltage offset(s) and corresponding read voltage level(s).

Figure 5:
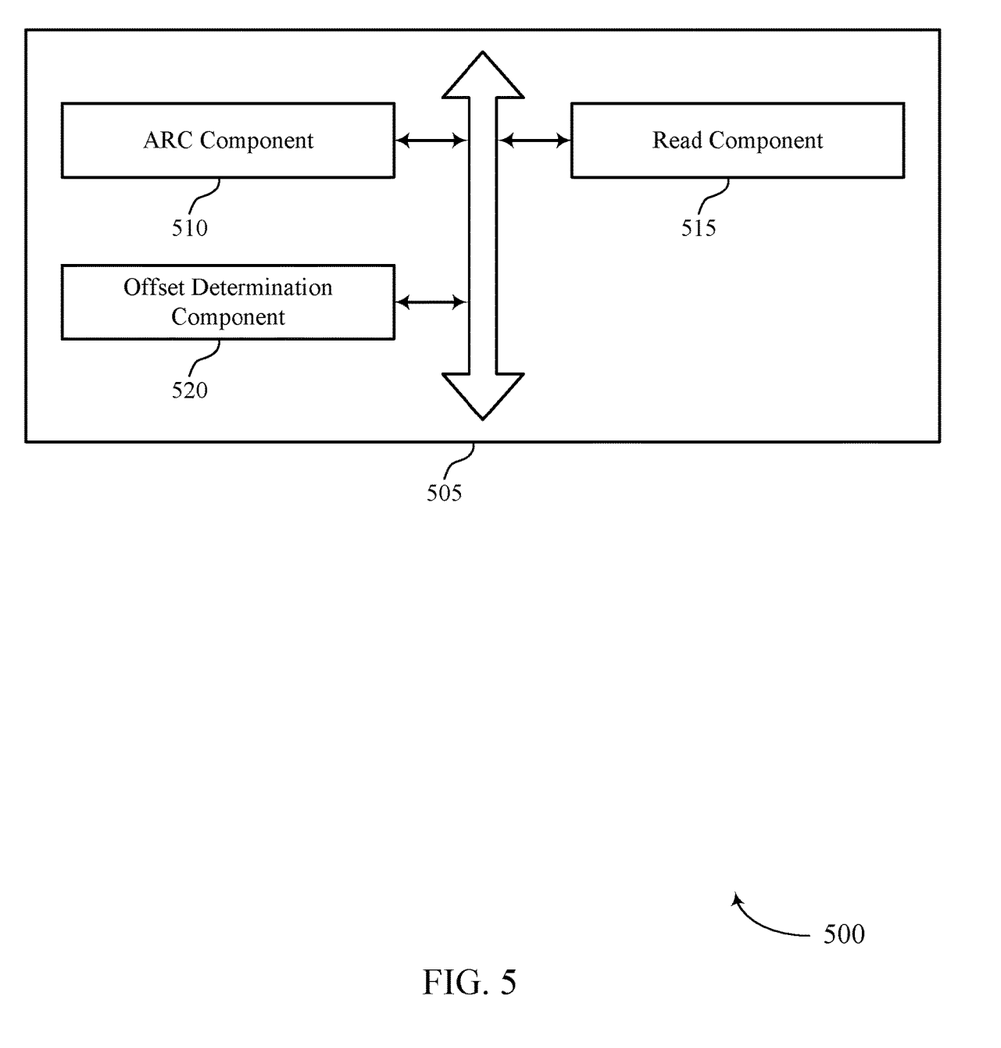
FIG. 5 shows a block diagram of a memory device that supports techniques for determining memory cell read offsets in accordance with aspects of the present disclosure.

FIG. 5 shows a block diagram 500 of a memory device 505 that supports techniques for determining memory cell read offsets in accordance with examples as disclosed herein. The memory device 505 may be an example of aspects of a memory device as described with reference to FIGS. 1-4. The memory device 505 may include an ARC component 510, a read component 515, and an offset determination component 520. Each of these modules may communicate, directly or indirectly, with one another (e.g., via one or more buses).

The ARC component 510 may determine a respective first voltage threshold offset for one or more levels of a multi-level memory cell based on a failure of a first read operation on the multi-level memory cell. In some cases, the multi-level memory cell includes a NAND memory cell.

In some examples, the ARC component 510 may perform, for each of the one or more levels and based on a read operation of the multi-level memory cell, an ARC procedure. The ARC procedure may include applying, to each level of the multi-level memory cell, multiple voltage thresholds to access the respective level of the multi-level memory cell. The ARC procedure may further include determining, for each of the one or more levels and based on applying the multiple voltage thresholds, a distribution of voltage threshold values and determining the respective first voltage threshold offsets based on a value from a corresponding distribution of voltage threshold values.

The read component 515 may perform a second read operation on the multi-level memory cell using the one or more first voltage threshold offsets. In some examples, the read component 515 may perform a third read operation on the multi-level memory cell using second voltage threshold offsets.

The offset determination component 520 may determine a respective second voltage threshold offset for the one or more levels of the multi-level memory cell based on a failure of the second read operation and based on adjusting at least one of the one or more first voltage threshold offsets according to a relationship between the one or more first voltage threshold offsets and the respective levels of the multi-level memory cell. In some examples, the offset determination component 520 may determine a linear association between at least a first portion of the one or more first voltage threshold offsets and the respective levels of the multi-level memory cell, where the relationship is based on the linear association.

In some examples, the offset determination component 520 may determine a non-linear association between a second portion of the one or more first voltage threshold offsets and the respective levels of the multi-level memory cell, where the relationship is based on the non-linear association. In some examples, the offset determination component 520 may access one or more values of the linear association configured during a calibration procedure, where a value of the linear association includes a slope value.

Figure 6:
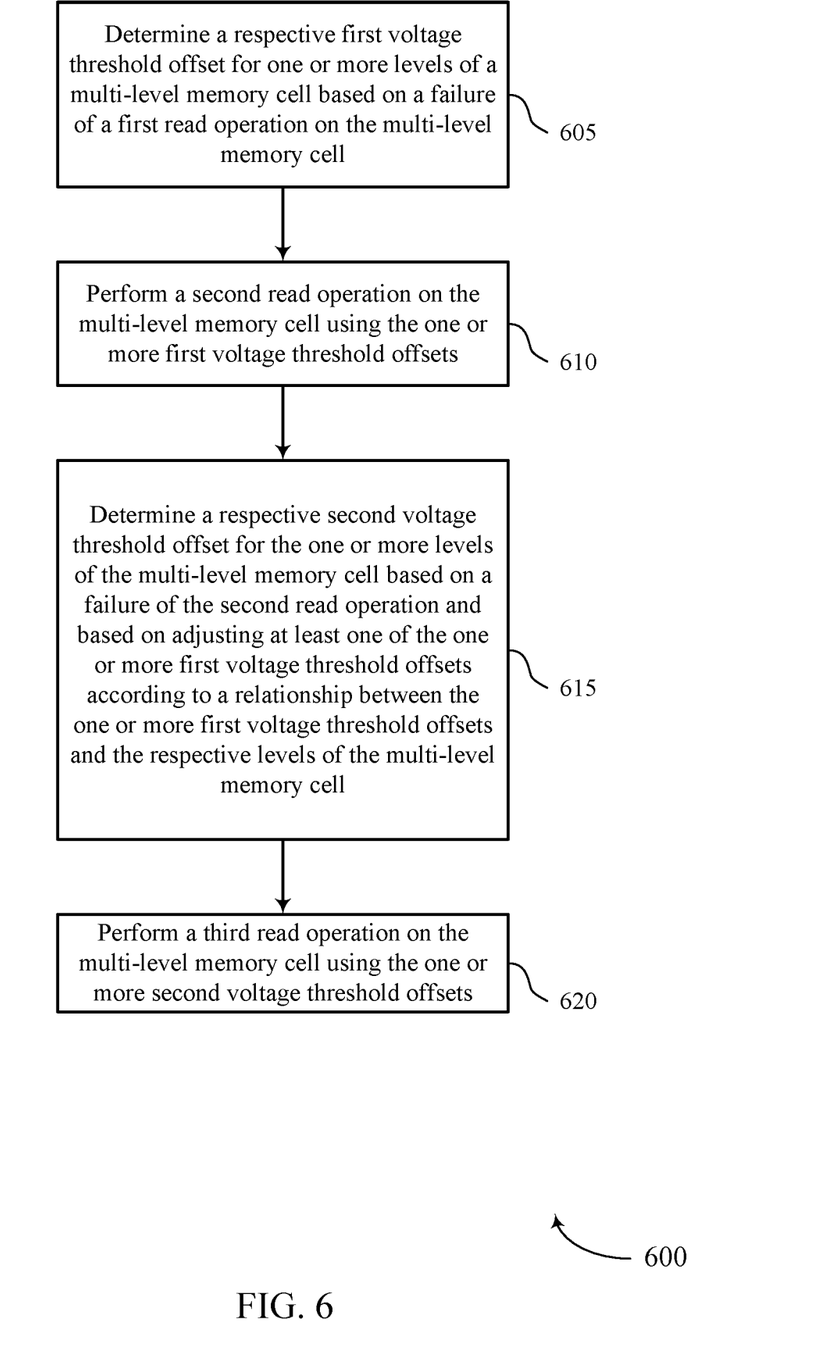
FIG. 6 shows a flowchart illustrating a method or methods that support techniques for determining memory cell read offsets in accordance with examples as disclosed herein.

FIG. 6 shows a flowchart illustrating a method or methods 600 that supports techniques for determining memory cell read offsets in accordance with aspects of the present disclosure. The operations of method 600 may be implemented by a memory device or its components as described herein. For example, the operations of method 600 may be performed by a memory device as described with reference to FIG. 5. In some examples, a memory device may execute a set of instructions to control the functional elements of the memory device to perform the described functions. Additionally or alternatively, a memory device may perform aspects of the described functions using special-purpose hardware.

At 605, the memory device may determine a respective first voltage threshold offset for one or more levels of a multi-level memory cell based on a failure of a first read operation on the multi-level memory cell. The operations of 605 may be performed according to the methods described herein. In some examples, aspects of the operations of 605 may be performed by an ARC component as described with reference to FIG. 5.

At 610, the memory device may perform a second read operation on the multi-level memory cell using the one or more first voltage threshold offsets. The operations of 610 may be performed according to the methods described herein. In some examples, aspects of the operations of 610 may be performed by a read component as described with reference to FIG. 5.

At 615, the memory device may determine a respective second voltage threshold offset for the one or more levels of the multi-level memory cell based on a failure of the second read operation and based on adjusting at least one of the one or more first voltage threshold offsets according to a relationship between the one or more first voltage threshold offsets and the respective levels of the multi-level memory cell. The operations of 615 may be performed according to the methods described herein. In some examples, aspects of the operations of 615 may be performed by an offset determination component as described with reference to FIG. 5.

At 620, the memory device may perform a third read operation on the multi-level memory cell using the one or more second voltage threshold offsets. The operations of 620 may be performed according to the methods described herein. In some examples, aspects of the operations of 620 may be performed by a read component as described with reference to FIG. 5.

In some examples, an apparatus as described herein may perform a method or methods, such as the method 600. The apparatus may include features, means, or instructions (e.g., a non-transitory computer-readable medium storing instructions executable by a processor) for determining a respective first voltage threshold offset for one or more levels of a multi-level memory cell based on a failure of a first read operation on the multi-level memory cell, performing a second read operation on the multi-level memory cell using the one or more first voltage threshold offsets, determining a respective second voltage threshold offset for the one or more levels of the multi-level memory cell based on a failure of the second read operation and based on adjusting at least one of the one or more first voltage threshold offsets according to a relationship between the one or more first voltage threshold offsets and the respective levels of the multi-level memory cell, and performing a third read operation on the multi-level memory cell using the one or more second voltage threshold offsets.

Some examples of the method 600 and the apparatus described herein may further include operations, features, means, or instructions for determining a linear association between at least a first portion of the one or more first voltage threshold offsets and the respective levels of the multi-level memory cell, where the relationship may be based on the linear association.

Some examples of the method 600 and the apparatus described herein may further include operations, features, means, or instructions for determining a non-linear association between a second portion of the one or more first voltage threshold offsets and the respective levels of the multi-level memory cell, where the relationship may be based on the non-linear association.

In some examples of the method 600 and the apparatus described herein, determining the one or more second voltage threshold offsets may include operations, features, means, or instructions for accessing one or more values of the linear association configured during a calibration procedure, where a value of the linear association includes a slope value.

In some examples of the method 600 and the apparatus described herein, the linear association configured values may be based on modifying one or more access parameters for the one or more levels of the multi-level memory cell, where the one or more access parameters include a voltage level associated of an access operation of the multi-level memory cell, a number of accesses of the multi-level memory cell, a temperature associated with an access operation of the multi-level memory cell, or any combination thereof.

In some examples of the method 600 and the apparatus described herein, determining the one or more first voltage threshold offsets may include operations, features, means, or instructions for performing, for each of the one or more levels and based on a read operation of the multi-level memory cell, an auto-recovery calibration procedure, the auto-recovery calibration procedure including.

In some examples of the method 600 and the apparatus described herein, the one or more first voltage threshold offsets and the one or more second voltage threshold offsets each include an offset to a static voltage threshold for reading a respective level of the multi-level memory cell. In some examples of the method 600 and the apparatus described herein, the multi-level memory cell includes a NAND memory cell.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a memory array and a control component coupled with the memory array and configured to cause the apparatus to: determine a respective first voltage threshold offset for one or more levels of a multi-level memory cell based on a failure of a first read operation on the multi-level memory cell, perform a second read operation on the multi-level memory cell using the one or more first voltage threshold offsets, determine a respective second voltage threshold offset for the one or more levels of the multi-level memory cell based on a failure of the second read operation and based on adjusting at least one of the one or more first voltage threshold offsets according to a relationship between the one or more first voltage threshold offsets and the respective levels of the multi-level memory cell, and perform a third read operation on the multi-level memory cell using the one or more second voltage threshold offsets.

Some examples of the control component may further be configured to cause the apparatus to determine a linear association between at least a first portion of the one or more first voltage threshold offsets and the respective levels of the multi-level memory cell, where the relationship may be based on the linear association. Some examples of the control component may further be configured to cause the apparatus to determine a non-linear association between a second portion of the one or more first voltage threshold offsets and the respective levels of the multi-level memory cell, where the relationship may be based on the non-linear association. Some examples of the control component may further be configured to cause the apparatus to access one or more values of the linear association configured during a calibration procedure, where a value of the linear association includes a slope value.

In some examples, the one or more values may be based on modifying one or more access parameters for the one or more levels of the multi-level memory cell, where the one or more access parameters include a voltage level associated of an access operation of the multi-level memory cell, a number of accesses of the multi-level memory cell, a temperature associated with an access operation of the multi-level memory cell, or any combination thereof.

Some examples of the control component may further be configured to cause the apparatus to perform, for each of the one or more levels and based on a read operation of the multi-level memory cell, an ARC procedure, the ARC procedure including applying, to each level of the multi-level memory cell, multiple voltage thresholds to access the respective level of the multi-level memory cell. The ARC procedure may further include determining, for each of the one or more levels and based on applying the multiple voltage thresholds, a distribution of voltage threshold values and determining the respective first voltage threshold offsets based on a value from a corresponding distribution of voltage threshold values.

In some examples, the one or more first voltage threshold offsets and the one or more second voltage threshold offsets each include an offset to a static voltage threshold for reading a respective level of the multi-level memory cell. In some examples, the multi-level memory cell includes a NAND memory cell.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
a memory array; and
a control component coupled with the memory array and configured to cause the apparatus to:
determine a respective first voltage threshold offset for one or more levels of a multi-level memory cell, the multi-level memory cell configured for two or more levels; and
determine a respective second voltage threshold offset for the one or more levels of the multi-level memory cell based at least in part on adjusting at least one of the one or more first voltage threshold offsets according to a relationship between the one or more first voltage threshold offsets and the respective levels of the multi-level memory cell.

2. The apparatus of claim 1, wherein the control component is further configured to cause the apparatus to:
perform a first read operation on the multi-level memory cell, wherein determining the one or more first voltage threshold offsets is based at least in part on a failure of the first read operation.

3. The apparatus of claim 1, wherein the control component is further configured to cause the apparatus to:
perform a second read operation on the multi-level memory cell using the one or more first voltage threshold offsets, wherein determining the one or more second voltage threshold offsets is based at least in part on a failure of the second read operation.

4. The apparatus of claim 1, wherein the control component is further configured to cause the apparatus to:
perform a third read operation on the multi-level memory cell using the one or more second voltage threshold offsets.

5. The apparatus of claim 1, wherein the control component is further configured to cause the apparatus to:
determine a linear association between at least a first portion of the one or more first voltage threshold offsets and the respective levels of the multi-level memory cell, wherein the relationship is based at least in part on the linear association.

6. The apparatus of claim 1, wherein the control component is further configured to cause the apparatus to:
determine a non-linear association between at least a second portion of the one or more first voltage threshold offsets and the respective levels of the multi-level memory cell, wherein the relationship is based at least in part on the non-linear association.

7. The apparatus of claim 1, wherein the control component is further configured to cause the apparatus to:
access a location in the apparatus storing the relationship between the one or more first voltage threshold offsets and the respective levels of the multi-level memory cell.

8. The apparatus of claim 7, wherein one or more values associated with the relationship are configured using a calibration procedure based at least in part on modifying one or more access parameters for the one or more levels of the multi-level memory cell during the calibration procedure, the one or more access parameters comprising a voltage level associated of an access operation of the multi-level memory cell, a number of accesses of the multi-level memory cell, a temperature associated with an access operation of the multi-level memory cell, or any combination thereof.

9. The apparatus of claim 1, wherein the control component is further configured to cause the apparatus to:
perform, for each of the one or more levels and based at least in part on a read operation of the multi-level memory cell, an auto-recovery calibration procedure, the auto-recovery calibration procedure comprising:
applying, to each level of the multi-level memory cell, multiple voltage thresholds to access the respective level of the multi-level memory cell;
determining, for each of the one or more levels and based at least in part on applying the multiple voltage thresholds, a distribution of voltage threshold values; and
determining the respective first voltage threshold offsets based at least in part on a value from a corresponding distribution of voltage threshold values.

10. The apparatus of claim 1, wherein the one or more first voltage threshold offsets and the one or more second voltage threshold offsets each comprise an offset to a static voltage threshold for reading a respective level of the multi-level memory cell, and wherein the multi-level memory cell comprises a not-AND (NAND) memory cell.

11. The apparatus of claim 1, wherein a second multi-level memory cell has a second relationship between one or more respective third voltage threshold offsets for one or more levels of the second multi-level memory cell and the respective levels of the second multi-level memory cell.

12. The apparatus of claim 11, wherein the relationship is associated with a first group of multi-level memory cells that comprises the multi-level memory cell and the second relationship is associated with a second group of multi-level memory cells that comprises the second multi-level memory cell.

13. A non-transitory computer-readable medium storing code comprising instructions, which when executed by a processor of an electronic device, cause the electronic device to:
determine a respective first voltage threshold offset for one or more levels of a multi-level memory cell, the multi-level memory cell configured for two or more levels; and
determine a respective second voltage threshold offset for the one or more levels of the multi-level memory cell based at least in part on adjusting at least one of the one or more first voltage threshold offsets according to a relationship between the one or more first voltage threshold offsets and the respective levels of the multi-level memory cell.

14. The non-transitory computer-readable medium of claim 13, wherein the instructions, when executed by the processor of the electronic device, further cause the electronic device to:
perform a first read operation on the multi-level memory cell, wherein determining the one or more first voltage threshold offsets is based at least in part on a failure of the first read operation.

15. The non-transitory computer-readable medium of claim 13, wherein the instructions, when executed by the processor of the electronic device, further cause the electronic device to:
perform a second read operation on the multi-level memory cell using the one or more first voltage threshold offsets, wherein determining the one or more second voltage threshold offsets is based at least in part on a failure of the second read operation.

16. The non-transitory computer-readable medium of claim 13, wherein the instructions, when executed by the processor of the electronic device, further cause the electronic device to:
determine a linear association between at least a first portion of the one or more first voltage threshold offsets and the respective levels of the multi-level memory cell, wherein the relationship is based at least in part on the linear association.

17. The non-transitory computer-readable medium of claim 13, wherein the instructions, when executed by the processor of the electronic device, further cause the electronic device to:
determine a non-linear association between at least a second portion of the one or more first voltage threshold offsets and the respective levels of the multi-level memory cell, wherein the relationship is based at least in part on the non-linear association.

18. The non-transitory computer-readable medium of claim 13, wherein the instructions, when executed by the processor of the electronic device, further cause the electronic device to:
access a location in the electronic device storing the relationship between the one or more first voltage threshold offsets and the respective levels of the multi-level memory cell.

19. The non-transitory computer-readable medium of claim 13, wherein a second multi-level memory cell has a second relationship between one or more respective third voltage threshold offsets for one or more levels of the second multi-level memory cell and the respective levels of the second multi-level memory cell.

20. A method, comprising:
determining a respective first voltage threshold offset for one or more levels of a multi-level memory cell, the multi-level memory cell configured for two or more levels; and
determining a respective second voltage threshold offset for the one or more levels of the multi-level memory cell based at least in part on adjusting at least one of the one or more first voltage threshold offsets according to a relationship between the one or more first voltage threshold offsets and the respective levels of the multi-level memory cell.

* * * * *